US008652647B2

(12) United States Patent
Kourtakis

(10) Patent No.: US 8,652,647 B2
(45) Date of Patent: *Feb. 18, 2014

(54) ARTICLES COMPRISING PHYLLOSILICATE COMPOSITES CONTAINING MICA

(75) Inventor: Kostantinos Kourtakis, Media, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 571 days.

This patent is subject to a terminal disclaimer.

(21) Appl. No.: 12/840,497

(22) Filed: Jul. 21, 2010

(65) Prior Publication Data

US 2012/0017992 A1    Jan. 26, 2012

(51) Int. Cl.
*B32B 23/04* (2006.01)

(52) U.S. Cl.
USPC ........ 428/532; 428/537.5; 428/446; 428/447; 428/449

(58) Field of Classification Search
USPC .................. 428/532, 449, 447, 446, 537.5
See application file for complete search history.

(56) References Cited

U.S. PATENT DOCUMENTS

| | | | | |
|---|---|---|---|---|
| 2,948,329 A | * | 8/1960 | Gaines et al. | 427/344 |
| 3,989,875 A | * | 11/1976 | Bayles et al. | 428/447 |
| 4,803,113 A | * | 2/1989 | Sklarski et al. | 428/182 |
| 7,663,056 B2 | | 2/2010 | Yonezawa et al. | |
| 2008/0026180 A1 | * | 1/2008 | Bush et al. | 428/141 |
| 2009/0065060 A1 | | 3/2009 | Yonezawa et al. | |
| 2009/0133749 A1 | | 5/2009 | Yonezawa | |
| 2009/0202806 A1 | | 8/2009 | Ebina et al. | |
| 2009/0205715 A1 | | 8/2009 | Yonezawa et al. | |
| 2009/0239037 A1 | | 9/2009 | Tsuda et al. | |

OTHER PUBLICATIONS

Antonio Luque and Steven Hegedus, Handbook of Photovoltaic Science and Engineering (2003) Chapter 12. (Reference Book).
Kirk-Othmer, Concise Encyclopedia of Chemical Technology, Micas, Natural and Synthetic (1985) pp. 758-760.

* cited by examiner

*Primary Examiner* — Leszek Kiliman

(57) ABSTRACT

Disclosed is a mica paper composite and a process for making the mica paper composite. Articles comprising the mica paper composite are also disclosed.

11 Claims, No Drawings

ARTICLES COMPRISING PHYLLOSILICATE COMPOSITES CONTAINING MICA

FIELD OF THE INVENTION

Mica paper composites and processes for making them are provided. Articles comprising the mica paper composites, such as photovoltaic cells, are also provided.

BACKGROUND

Photovoltaic cells, which receive light and convert the light into electric energy, are made by depositing various layers of materials on a substrate. The most common substrate material used in the manufacture of thin film Cu(In,Ga)Se (CIGS) photovoltaic cells is glass because glass provides a good balance of properties at moderate cost. In particular, glass provides good mechanical support; is thermally and chemically stable to the processes used to deposit various layers of the thin film photovoltaic cell onto the substrate; is electrically insulating; and provides excellent barrier properties to protect the water and oxygen-sensitive layers of the photovoltaic cell. In addition, glass has a smooth surface, which enables the surface of a film that is placed on the glass to be made relatively smooth in turn.

Glass substrates also have some disadvantages. They are heavy, prone to breakage, and generally too rigid to be used in potentially more economical roll-to-roll processes. These disadvantages have motivated the search for alternative substrates. Metal foils can be used as substrates, but have the distinct disadvantage that they are electrically conductive and are also heavy. Organic polymers, such as polyimides, are amenable to use in roll-to-roll processes and can be weight-saving substrates in many applications, but they do not have sufficient thermal and dimensional stability at the high temperatures, for example above 500° C., which are needed to realize higher photovoltaic efficiencies for CIGS based devices. The use of mica as a substrate has also been reported.

U.S. Pat. No. 7,663,056 discloses a chalcopyrite type solar cell having a mica aggregate substrate formed by binding mica particulates with a resin.

US Published Patent Application No. 2009/0133749 discloses a chalcopyrite solar cell having a mica substrate or a laminated mica substrate.

US Published Patent Application No. 2009/0202806 discloses an inorganic layered compound film comprising an oriented denatured clay and exhibiting high water resistance, excellent pliability, excellent gas barrier properties and high heat resistance. The clay used in the denatured clay may be mica. The denatured clay may be reacted with a silylating agent.

US Published Patent Application No. 2009/0205715 discloses a solar cell which includes a substrate of mica or material containing mica; an intermediate layer for smoothing or planarizing a surface of the substrate, which is formed on the substrate; a binder layer formed on the intermediate layer; a metallic lower part electrode layer formed on the binder layer; a p-type light absorbing layer formed on the metallic lower part electrode layer, and made of chalcopyrite based material; an n-type buffer layer formed on the light absorbing layer; and an n-type transparent electrode layer formed on the buffer layer.

Mica substrates that are flexible, tolerant of the high temperatures used to create the photoactive layers, inexpensive, and suitable for use in roll-to-roll processes continue to be sought. Mica substrates which furthermore have improved or suitable tear initiation resistance, improved water resistance, and a thermal expansion coefficient similar to that of the metal used in a back electrode of a photovoltaic cell are especially sought.

SUMMARY

In one aspect, the present invention is an article comprising a mica paper composite comprising a composition having the general Formula (VI):

$$[K_{0.65}Al_2[Al_{0.65}Si_{3.35}O_{10}](OH)_2]_j[M'''O_{(n-g)}(OH)_g]_{(1-j)} \quad (VI)$$

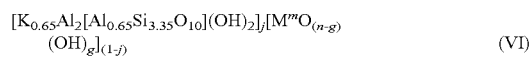

wherein
1) M is selected from Si, Al, Ti, Zr, and mixtures thereof; with the proviso that:
   i) when M is Si, Ti, or Zr, the value of m is 4; and
   ii) when M is Al, the value of m is 3;
2) n is a value represented by m/2;
3) g and (n-g) represent molar proportions, where g is a value selected from the range of 0 to n;
4) j represents the weight fraction of mica in the mica paper composite, and the value of j is selected from the range of 0.995 to 0.8.

DETAILED DESCRIPTION OF THE INVENTION

Applicants specifically incorporate the entire contents of all cited references in this disclosure. As used herein, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

DEFINITIONS

The following definitions are used in this disclosure:

"Mica paper" refers to a thin sheet of mineral derived from phyllosilicates of the mica group.

"Impregnating" refers to a process in which a substrate, for example mica paper, contacts a liquid composition.

"Dip coating" refers to a process in which a substrate is immersed in a liquid composition and then removed from the liquid composition.

"Gravure coating" refers to a process in which a substrate such as mica paper is contacted with a liquid composition in a roll to roll process. The roll surface is engraved with a pattern of cells which provide a specific coating volume. The roll is mounted in bearings and rotates partially submerged in a coating pan which contains the liquid composition to be coated onto the substrate. Rotation of the roll allows the substrate to pick up the coating, which is doctored (pre-metered) by a flexible steel blade as the roll rotates toward the contact point with the substrate. Standard gravure methods (reverse or direct) use a backing roll, usually rubber covered, having about the same diameter as the engraved roll. The substrate is trapped (nipped) between the engraved roll and the backing roll.

In "direct gravure coating", the rotation of the engraved cylinder is in the same direction as the travel direction of the substrate.

In "reverse gravure coating", the rotation of the engraved cylinder is opposite to the travel direction of the substrate and the liquid coating applied to the substrate experiences shear.

Micro Gravure™ is a reverse, kiss gravure coating method in which a backing roll which traps the substrate against the engraved roll is absent.

"Slot die coating" refers to a method of applying a liquid composition to a web, for example a web consisting of mica paper. The liquid is forced out from a reservoir through a slot by pressure and transferred to a moving web. In practice, the slot is generally much smaller in section than the reservoir, and is oriented perpendicular to the direction of web movement.

"Slot die" coating refers to a method of coating with a die "against" a web of mica paper, in which the mica paper substrate is actually separated from the web by a cushion of the liquid composition being coated.

"Bar coating" refers to a coating method in which a bar with a clearance or gap equivalent to the desired wet coating thickness is contacted with the mica paper substrate. In this process, the bar or the web (mica paper) can be conveyed in a constant direction. A bead of a liquid composition is applied to the bar prior to the conveyance of the bar or the mica paper.

"Rod coating" refers to a process which is similar to bar coating, except that a Mayer rod is used in place of the bar. The "Mayer" rod is a stainless steel rod that is wound tightly with stainless steel wire of varying diameter. The rod is used to doctor off the excess coating solution and to control the wet coating thickness. The wet thickness after doctoring is controlled by the diameter of the wire used to wind the rod.

"Spray coating" refers to a process whereby a liquid composition is atomized and applied to the surface of a substrate as small droplets of liquid.

"Spin coating" refers to a process in which coatings are applied to flat substrate surfaces by placing a fluid coating solution on the substrate and then rotating the substrate at high speed to spread the coating solution by centrifugal force.

"Planarizing" refers to a process for reducing the surface roughness of a substrate such as a mica paper composite. As used herein, planarizing includes the process of applying a coating to a substrate as well as the process of reducing the surface roughness of the substrate through the use of pressure and/or heat.

In the processes described herein, a mica paper is contacted with a composition comprising at least one alkoxide, wherein the alkoxide is selected from the group consisting of an aluminum alkoxide, a silicon alkoxide, a titanium alkoxide, and a zirconium alkoxide, to form an alkoxide-treated mica paper, which is then dried and calcined to obtain a mica paper composite. The mica paper composite may be used to fabricate various articles, including a photovoltaic cell.

Natural and synthetic micas are well known minerals, see, for example the entry in the Kirk-Othmer Concise Encyclopedia of Chemical Technology (John Wiley & Sons, 1985, p. 759-760). Mica paper useful in the present invention comprises at least one phyllosilicate of the mica group and contains no polymeric binders. The phyllosilicate may comprise muscovite, phlogopyte, illite, zinnwaldite, lepidolite, paragonite, biotite, fluorophlogopite, or combinations thereof. In one embodiment, the mica paper comprises muscovite, illite, or a combination thereof. Mica paper sheets having typical thickness between 0.25 mil and 4 mils can be formed from mica-containing pulp by conventional paper processes. In one embodiment of the present invention, a mica paper sheet thickness in the range of about 0.5 mil to about 3.0 mils is preferred. Mica paper suitable for use herein may be obtained from commercial sources.

In one embodiment of the process to obtain a mica paper composite, the composition comprises decomposition products derived from at least one alkoxide of Formula (I), Formula (II), or mixtures thereof,

$$Q_x Al(OR)_y \qquad (I)$$

$$Q_p M''(OR)_q \qquad (II)$$

wherein:
1) Q is hydrogen or an organic group having from 1 to 20 carbon atoms; and
  i) x is 0, 1, or 2; and
  ii) y is 1, 2, or 3, with the proviso that x+y=3;
2) M" is Si, Ti, or Zr;
  i) p is 0, 1, 2, or 3; and
  ii) q is 1, 2, 3, or 4, with the proviso that p+q=4; and
each OR moiety independently has a structure OR', OR", OR''', or OR'''' wherein the radicals R', R", R''', and R'''' are independently an unsubstituted or substituted alkyl group having from 1 to 20 carbon atoms, an unsubstituted or substituted aromatic group having from 6 to 18 carbon atoms, or an unsubstituted or substituted cycloaliphatic group having from 6 to 18 carbon atoms.

In one embodiment, Q represents an organic group having from 1 to 10 carbon atoms. Suitable organic groups include methyl, ethyl, butyl, and phenyl groups. In one embodiment, the radicals R', R", R''', and R'''' are independently an unsubstituted or substituted alkyl group having from 1 to 10 carbon atoms, an unsubstituted or substituted aromatic group having from 6 to 10 carbon atoms, or an unsubstituted or substituted cycloaliphatic group having from 6 to 10 carbon atoms.

Suitable alkyl groups include substituted and unsubstituted, saturated and unsaturated, alkyl groups such as methyl, ethyl, n-propyl, iso-propyl, n-butyl, iso-butyl, sec-butyl, tert-butyl, amyl, pentyl, hexyl, heptyl, octyl, nonyl, vinyl, propenyl, acyloyloxy, methacryloyloxy, and acrylic groups. Examples of suitable aromatic groups include phenyl and napthyl groups. Suitable cycloaliphatic groups include substituted and unsubstituted, saturated and unsaturated, cycloaliphatic groups such as cyclohexyl, methylcyclohexyl, dimethylcyclohexyl, ethylcyclohexyl, propylcyclohexyl, and butylcyclohexyl groups.

Examples of alkoxides suitable for use in the present invention include tetraethylorthosilicate, titanium isopropoxide, titanium 2-ethyl hexanolate, titanium n-butoxide, titanium ethoxide, zirconium n-propoxide, zirconium n-butanolate (zirconium n-butoxide), vinyltrimethoxysilane, vinyltriethoxysilane, and 3-methacryloxypropyltrimethoxysilane. Titanium isopropoxide and tetraethylorthosilicate are preferred. The alkoxides may be obtained from commercial sources or, alternatively may be prepared by known methods.

Optionally, the composition comprising at least one alkoxide may comprise an organic solvent in which the at least one alkoxide of Formula (I) and/or Formula (II) is soluble. The solvent may be an alcohol, acetate, amide, aromatic hydrocarbon, aliphatic hydrocarbon, chlorinated aliphatic hydrocarbon, or a mixture thereof. Suitable solvents include alcohols such as methanol, ethanol, propanols, and butanols; acetates such as ethyl acetate; amides such as dimethylacetamide and dimethylformamide; aromatic hydrocarbons such as benzene, toluene, and xylenes; aliphatic hydrocarbons such as hexanes and heptanes, and chlorinated aliphatic hydrocarbons such as dichloromethane. The choice of solvent should be made judiciously to avoid unwanted byproducts and/or decrease the amount of available alkoxide. For example, the organic solvent should be substantially anhydrous or water free in order to avoid hydrolysis of the alkoxide.

The contacting of the mica paper with a composition comprising at least one alkoxide may be performed by any suitable means whereby the mica paper imbibes sufficient liquid so that at least some of the composition comprising at least one alkoxide is absorbed into its pores and onto its surface. For example, contact can be by impregnating, dip coating, direct gravure coating, reverse gravure coating, direct microgravure coating, reverse microgravure coating, slot die coating, bar coating, rod coating, spray coating, spin coating, or a combination thereof. The contacting of the mica paper with a composition comprising at least one alkoxide is carried out for a time sufficient to introduce the desired amount of alkoxide to the mica paper.

The duration of the contact typically may be from about 0.01 seconds to about 5 hours. The contact period can be chosen using various factors to inform the choice. For example, the efficiency of the imbibing of the liquid or economic considerations may influence the duration of contact. A shorter period of time may be preferable for practical and/or economic reasons. Typically a period of contact may be from about 0.1 seconds to about 60 minutes. The contacting of the mica paper with a composition comprising at least one alkoxide may be performed at a relatively high temperature for a relatively short period of time, or at a lower temperature for a longer period of time.

For the contacting of the mica paper with a composition comprising at least one alkoxide, the temperature, contacting time, type of mica paper, thickness of the mica paper, specific alkoxide used, alkoxide loading, the total pore volume, and the surface area of the paper are related; thus, these variables can be adjusted with consideration given to the effect that such adjustment will have on the product obtained.

After contacting the alkoxide composition, the alkoxide-treated mica paper is dried, that is, the solvent is evaporated from the treated paper. For example the treated paper can be dried in air at room temperature, or by heating to temperatures up to about 200° C. The dried alkoxide-treated mica paper is then calcined to obtain a mica paper composite. The calcining step is performed by heating the dried alkoxide-treated mica paper for a time and at a temperature sufficient to decompose the at least one alkoxide to form decomposition products comprising oxides, oxyhydroxides, or a combination thereof. In one embodiment, after calcining the mica paper composite contains from about 0.5 weight percent to about 30 weight percent alkoxide decomposition products comprising oxides, oxyhydroxides, or a combination thereof. In other embodiments the calcined mica paper composite may contain, for example, from about 0.5 weight percent to about 25 weight percent, or from about 1 weight percent to about 20 weight percent, or from about 0.5 weight percent to about 15 weight percent, or from about 0.5 weight percent to about 10 weight percent, or from about 0.5 weight percent to about 5 weight percent of decomposition products. For the calcining step, temperatures greater than approximately 300° C. are required for a time period ranging between 1 minute and 12 hours. A preferred temperature range is about 500° C. to about 700° C. for a time period of about one minute to about one hour in air. An example of a suitable calcining method is presented in the Examples.

The present process may optionally further comprise a planarization step to improve the surface smoothness (that is, reduce the surface roughness) of the mica paper composite. Planarization of the mica surface can be necessary because irregularities in the surface of the mica paper composite can be reproduced in layers deposited on top of the mica paper composite, for example in an electrode layer and in a light absorption layer, and can negatively affect a CIGS solar cell, for example by decreasing the open circuit voltage. If carried out, the planarization step may be performed after drying (before calcining) or after calcining.

Planarization processes are known, particularly for hard, non-porous surfaces. Typically, a planarizing coating can be applied by a number of methods, including coating liquid precursors by dip coating, spray coating, gravure, reverse gravure, microgravure and spin coating processes. The planarizing layer can also be applied by other conventional methods including laminating, physical vapor deposition (evaporative deposition, sputter deposition, pulsed laser deposition or laser ablation), or chemical vapor deposition. Planarization can also be performed by any method which applies pressure and optionally heat to the surface of the mica paper, the mica paper composite, or an uncalcined precursor. Planarization methods used in paper processing technology (calendering or thermal calendering) can be used. By adjusting the number of rolls, the number of nips, nip pressure and the like, it is possible to planarize both sides of the mica containing paper by passing the paper through nip rollers in a continuous, roll to roll process.

The planarization can be performed by, for example, a method to heat the material after coating with the planarizing solution and then to apply pressure on the coated surface, a method to carry out a smoothing roll treatment after the coating step, a method to apply a mirror finish in the drying process, a method to treat the coated material by passing it through a multicylinder dryer roll or a Yankee dryer roll that is planarized, and other methods.

For example, for the treatment carried out by applying pressure and heat on the surface of the mica paper composite (or of an uncalcined precursor), planarization methods used in the paper processing technology, such as thermal calender and super calender treatments, can be used. With the thermal calender treatment, it is possible to achieve easy planarization due to the removal of water contained in the mica paper composite, since heat can be applied in addition to the planarization by the roll pressure. With the super calender treatment, by adjusting the number of rolls, the number of nips and/or nip pressure, it is possible to planarize both sides of the mica at the same time to achieve two surfaces with equivalent surface flatness. In either case, it is required that the surface of the calender roll used has a certain degree of flatness and is preferably 100 nm or less in terms of surface roughness Ra. The roll surface with such surface flatness can be planarized by mirror finish, polishing, or other methods.

In addition, it is also possible to use a general heat press machine as a means of applying heat and pressure. As the heat press machine, an apparatus which is capable of applying heat and pressure by the use of a roll, a batch heat press machine, or the like can be used. In order to achieve a continuous mica paper composite, it is preferable to use an apparatus which applies heat and pressure by the use of a roll. It is also possible to cut out a piece of mica paper composite of a certain size from the continuous mica paper composite and subject the piece to a further batch-wise pressing treatment using a heat press machine in order to improve the surface planarization. Part of the heat press machine which contacts the surface of the mica paper composite, that is, the press plate, preferably has a surface roughness Ra of 100 nm or less. The mica paper composite will have a uniform film thickness and a small surface roughness due to the application of pressure by a heat press machine.

The above treatment by a heat press machine is preferably carried out in a vacuum. By performing the treatment in a vacuum, it is possible to reduce the extent of voids inside a mica paper composite and achieve a denser mica paper composite.

As another method to planarize the surface, a method employing a smoothing roll treatment and other methods can be adopted. For example, immediately after coating the substrate surface by an appropriate coating method, it is possible to improve surface flatness by smoothing the surface using a smoothing roll. A heated smoothing roll can also be used.

In the present invention, it is also possible to combine the above-mentioned planarization methods or other planarization methods for use. Moreover, by appropriately adjusting the roll materials used, the applied pressure, the heating temperature, the feeding speed and the frequency, and the planarizing solution, the desired degree of flatness can be achieved.

Alternatively, the surface smoothness of the mica paper composite may be improved by application of heat and/or pressure as described above but without first coating the mica paper composite with a planarizing solution. Calendering is an example of such a method of improving the surface smoothness. The present process may optionally further comprise a step of calendering the mica paper before contacting it with a composition comprising at least one alkoxide, calendering the dried alkoxide-treated mica paper, or calendering the mica paper composite after calcining.

One embodiment of the present invention is a mica paper composite comprising oxides, oxyhydroxides, or a combination thereof which are derived from decomposition of an aluminum alkoxide.

One embodiment of the present invention is a mica paper composite comprising oxides, oxyhydroxides, or a combination thereof which are derived from decomposition of a silicon alkoxide, a titanium alkoxide, a zirconium alkoxide, or a combination thereof.

In another embodiment, the present invention is a mica paper composite comprising the decomposition product of an alkoxide of Formula (I):

$$Q_xAl(OR)_y \qquad (I)$$

In another embodiment, the present invention is a mica paper composite comprising the decomposition product of an alkoxide of Formula (II):

$$Q_pM''(OR)_q \qquad (II)$$

One embodiment of the present invention is a mica paper composite comprising a composition represented by Formula (III):

Formula (III)

wherein:
1) A, B, C, and D are metals independently selected from Li, Na, K, Rb, Cs, Mg, Ca, Sr, Ba, Fe, Ti, Cr, Al, and Mn;
2) a, b, c, d, x, and v represent molar proportions wherein
   i) x is a value in the range of 0.13 to 2;
   ii) v is a value in the range of 0 to 1; and
   iii) a, b c, and d are values within the range of zero (0) and the quantity defined by (x+6)/0x, wherein Ox is the corresponding oxidation state a', b', c' or d';
3) a', b', c', d' and m represent oxidation states having integer values each independently in the range of from +1 to +6;

with the proviso that:
   (i) when the molar proportion (a, b, c, or d) is multiplied by the oxidation state (a', b', c', or d') of the corresponding metal (A, B, C, or D) and the products of the mathematical operations are all added, the result equals the value of z, that is, $$a \cdot a' + b \cdot b' + c \cdot c' + d \cdot d' = z$$

ii) $y = -(x+4)$
iii) $z = 2-y$;
4) M is selected from Si, Al, Ti, Zr, and mixtures thereof; with the proviso that
   i) when M is Si, Ti, or Zr, the value of m is 4; and
   ii) when M is Al, the value of m is 3;
5) n is a value represented by m/2;
6) g and (n-g) represent molar proportions, where g is a value in the range of 0 to n;
7) j represents the weight fraction of mica in the mica paper composite; and
8) the value of j is in the range of 0.995 to 0.7.

In one embodiment, a mica paper composite comprises a composition represented by Formula (IV). Formula (IV) is a version of Formula (III), wherein v is 0, n is 2, given by the general formula:

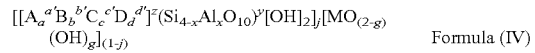
Formula (IV)

wherein:
1) A, B, C, and D are metals independently selected from Li, Na, K, Rb, Cs, Mg, Ca, Al, and Sr;
2) a, b, c, d, and x represent molar proportions wherein
   i) x is a value selected from the range of 0.5 to 1; and
   ii) a, b c, and d are values within the range of zero (0) and the quantity defined by (x+6)/Ox, wherein Ox is the corresponding oxidation state a', b', c' or d'.
3) a', b', c', d', represent oxidation states are integer values each independently in the range of +1 to +6;
with the proviso that:
   (i) when the molar proportion (a, b, c, or d) is multiplied by the oxidation state (a', b', c', or d') of the corresponding metal (A, B, C, or D) and the products of the mathematical operations are all added, the result equals the value of z, that is, $$a \cdot a' + b \cdot b' + c \cdot c' + d \cdot d' = z$$

ii) $y = -(x+4)$
iii) $z = 2-y$;
4) M is selected from Si, Ti, Zr, and mixtures thereof;
5) g and (2-g) represent molar proportions, where g is a value in the range of 0 to 2;
6) j represents the weight fraction of mica in the mica paper composite; and
7) the value of j is in the range of 0.995 to 0.7.

In one embodiment, the mica paper used to produce the mica paper composite comprises muscovite, and the mica paper composite comprises a composition represented by Formula (V)

Formula (V)

Formula (V) is a version of Formula (III) in which:
1) A is K; a is 1; a' is 1; B is Mg; b is 3; b' is 2; c is 0; d is 0; x is 1; and v is 0;
2) M is selected from Si, Al, Ti, Zr, and mixtures thereof, with the proviso that:
   i) when M is Si, Ti, or Zr, the value of m is 4; and
   ii) when M is Al, the value of m is 3;
3) n is a value represented by m/2;
4) g and (n-g) represent molar proportions, where g is a value in the range of 0 to n;

5) j represents the weight fraction of mica in the mica paper composite; and
6) the value of j is in the range of 0.995 to 0.8.

In one embodiment, the mica paper used to produce the mica paper composite comprises illite, and the mica paper composite comprises a composition represented by Formula (VI)

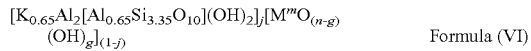
Formula (VI)

Formula (VI) is a version of Formula (III) in which:
1) A is K; a is 0.65; a' is 1; B is Al; b is 2; b' is 3; c is 0; d is 0; x is 0.65, and v is 0;
2) M is selected from Si, Al, Ti, Zr, and mixtures thereof; with the proviso that:
   i) when M is Si, Ti, or Zr, the value of m is 4; and
   ii) when M is Al, the value of m is 3;
3) n is a value represented by m/2;
4) g and (n-g) represent molar proportions, where g is a value selected from the range of 0 to n;
5) j represents the weight fraction of mica in the mica paper composite, and the value of j is selected from the range of 0.995 to 0.8.

In one embodiment, the mica paper composite is made by the process described herein. In one embodiment of the invention, a photovoltaic cell comprises the mica paper composite.

The mica paper composite disclosed herein is an insulator having an extremely high resistance, for example ranging from $10^{12}$ to $10^{16}$ ohms. The mica paper composite is also tolerant of high temperature, for example temperatures in the range of about 600° C. to about 800° C., and is highly resistant to water, acids, alkalis, and $H_2Se$ gas. In addition, the mica paper composite is light in weight, tear resistant, and highly flexible, which enables it to be wound in a rolled form, for example in a roll-to-roll process for manufacturing photovoltaic cells. Having these characteristics, the mica paper composites described herein are useful as substrates for layered assemblies or other devices. For example, the mica paper composites can be used in an assembly comprising a mica paper composite and a conductive electrode layer, wherein the electrode layer comprises Mo, W, Cr, or mixtures thereof. Such an assembly may further comprise a light absorber layer, which may optionally comprise Cu, In, Ga, and Se. Alternatively, the light absorber layer may optionally comprise Cu, Zn, Sn, and S. The assembly comprising a light absorber layer may further comprise a buffer layer, such as CdS. An example of a device comprising such an assembly is a photovoltaic cell.

Thin-film photovoltaic (PV) cells typically comprise a substrate, a conductive (electrode) layer, a light absorber layer of photovoltaic material, an n-type buffer layer thin film formed by InS, ZnS, CdS or the like, a transparent conducting oxide (TCO) layer formed from aluminum doped ZnO or the like, and a metal grid top contact layer. Some embodiments may optionally contain one or more layers selected from buffer layers and interconnect layers.

In the photovoltaic cell of this invention, the substrate is a mica paper composite prepared as described above. The conductive layer is a metal layer that has been deposited on the mica paper composite layer. This provides a flexible inorganic substrate for photovoltaic cells that is light-weight and thermally stable at 450-700° C.

The conductive layer comprises Mo, W, Cr, or mixtures thereof. The conductive metal is typically deposited to a thickness of 200-1000 nm by sputtering onto the mica paper composite layer. Preferably, the conductive layer is uniform in thickness and pin-hole-free.

The photovoltaic material for the light absorber layer is selected from the group consisting of amorphous silicon (a-Si), cadmium telluride (CdTe), copper indium (gallium) di-selenide/sulfide (CIS/CIGS), $CuInSe_2$, $CuInS_2$, $CuGaSe_2$, $CuInS_2$, $CuGaS_2$, $CUAISe_2$, $CuAIS_2$, $CuAITe_2$, $CuGaTe_2$, $Cu_2ZnSnS_4$, $Cu_2ZnSnSe_4$, and combinations thereof. The layer of photovoltaic material is deposited on the conductive layer. In one embodiment, the light absorber layer comprises Cu, In, Ga, and Se. In one embodiment, CIGS is applied by co-evaporation of Cu, In and Ga in the presence of Se vapor 600° C., followed by chemical bath deposition of CdS. In another embodiment, CZTS (copper zinc tin sulfide) is applied by printing an ink of precursor particles on the conductive layer, followed by annealing at 600° C. The annealing step is followed by chemical bath deposition of CdS.

The TCO layer typically includes mixtures or doped oxides of $In_2O_3$, $SnO_2$, ZnO, CdO, and $Ga_2O_3$. Common examples in PV cells include ITO ($In_2O_3$ doped with about 9 atomic % Sn) and AZO (ZnO doped with 3-5 atomic % Al). In one embodiment, ZnO is sputter deposited onto the layer of photovoltaic material.

The metal grid top contact layer typically comprises a patterned metal layer, where the metal is selected from the group consisting of copper, silver, gold, nickel, chromium, aluminum and mixtures thereof. In one embodiment, e-beam evaporation is used to deposit Ni/Al grids.

In some embodiments, an anti-reflective coating is deposited on the metal grid top contact layer. Suitable anti-reflective coatings include $MgF_2$.

The structure of a-Si and nc-Si solar cells is commonly p-i-n for a single cell, wherein "n" refers to n-type Si, "i" refers to insulating Si, and "p" refers to p-type Si. Tandem cells with higher efficiency are produced by stacking this basic cell and optimizing the absorption of the stack.

Thin-film silicon solar cells typically comprise a TCO layer, a p-type Si alloy layer, an i-Si alloy layer, an n-type Si alloy layer, a buffer layer, a metal layer and a substrate. Thin-film silicon solar cells and amorphous silicon-based solar cells—including additional configurations such as, for example, multiple junction solar cells—are described in, for example, *Handbook of Photovoltaic Science and Engineering*, Antonio Luque and Steven Hegedus (2003), chapter 12. In the thin-film solar cells of this invention, the metal layer comprises Mo, W, Cr, or mixtures thereof and the substrate is a mica paper composite.

Amorphous or nanocrystalline Si is usually an alloy with hydrogen, i.e., a-Si:H or nc-Si:H. Doping n-type or p-type can be accomplished using common dopants used for crystalline Si. Suitable p-type dopants include Group III elements (e.g., B). Suitable n-type dopants include Group V elements (e.g., P). Alloying with Ge or C can also be used to change the optical absorption characteristics and other electrical parameters.

The buffer layer is typically a transparent, electrically insulating dielectric. Suitable materials include CdS, ZnSe, (Zn, Mg)O, $In(OH)_3$, $In_2S_3$, $In_2Se_3$, $InZnSe_x$, $SnS_2$, ZnO, $Ga_2O_3$, $SnO_2$, and $Zn_2SnO_4$.

In one embodiment, the photovoltaic cell may be laminated to top and bottom sheets using an encapsulant layer. The top and bottom sheets can be glass or polymer films that protect the photovoltaic material from oxygen and water. Ethylene copolymers such as EVA (ethylene vinyl acetate) are suitable encapsulants.

Suitable glass top sheets have high transmission (>80%) throughout the solar spectrum. In some embodiments, the glass sheets have antireflection coatings on at least one side of the glass sheet. Suitable anti-reflective coatings include fluoropolymers.

Suitable polymer sheets can be single layers of a polyester film or a fluoropolymer film, or can be multi-layer laminates comprising at least one layer of a polyester film and at least one layer of a fluoropolymer film bonded together by an adhesive. In some embodiments, at least one polymer sheet further comprises a layer of a metal, metal oxide or non-metal oxide.

Typically, the top sheet is transparent to solar radiation.

Leads are attached to the top and bottom conducting layers. Typically, Mo is the bottom conductive layer and a Ni/Al grid is the top conductive layer. These leads allow connection of the PV cell into a module structure.

EXAMPLES

The methods described herein are illustrated in the following examples. From the above discussion and these examples, one skilled in the art can ascertain the essential characteristics of this invention, and without departing from the spirit and scope thereof, can make various changes and modifications of the invention to adapt it to various uses and conditions.

The following materials were used in the examples. All commercial reagents were used as received. Binderless mica paper (76.2 microns (3 mils) thick was obtained from Corona Films (West Townsend, Mass., USA). Tetraethylorthosilicate (TEOS) was obtained from Sigma-Aldrich (St. Louis, Mo.). Tyzor® NBZ (zirconium tetra n-butanoate, 12 wt % in n-butanol), Tyzor® NPZ (zirconium tetra n-propanoate, 28 wt % in n-propanol), and Tyzor® TPT (neat tetraisopropyltitanate) were obtained from Dorf Ketal Specialty Catalysts, LLC, a subsidiary of Dorf Ketal Chemicals PVT. LTD. (Mumbai, India).

The coefficient of thermal expansion of the mica paper composites was measured by thermomechanical analysis (TMA). A TA Instrument (Model 2940) was set up in tension mode with a $N_2$ purge of 30-50 mL/min rate and a mechanical cooler. The mica paper composite was cut to a 2.0 mm width in the machine direction and clamped lengthwise between the film clamps, allowing for the measurement to be performed over a 7.5-9.0 mm length. The preload tension was set for 5 grams force. The mica paper composite was then heated from 0 to 400° C. at 10° C./min with a 3 minute hold after reaching 400° C. It was cooled to 0° C. and reheated to 400° C. at the same rate.

Tear initiation resistance (Grave's tear resistance) measurements were performed according to the procedures described in IPC-TM-650, number 2.4.16 (The Institute for Interconnecting and Packaging Electronic Circuits, Northbrook Ill.). An average of three measurements was used for each sample.

The following abbreviations are used: "C" is Celsius, "mm" is millimeter, "mL" is milliliter, "min" is minute(s), "d" is day(s), "cm" is centimeter, "g" is gram(s), "mg" is milligrams, "wt" is weight, "wt %" means weight percent, "h" is hour(s), "temp" or "T" is temperature.

Example 1

A 10.2 cm×20.3 cm (4 inch×8 inch) piece of binderless mica paper (76.2 microns thick, 3 mils) was taped onto a glass plate. Tetraethylorthosilicate (TEOS) was loaded into a 5 mL pipette and poured across a draw-down bar set for 381 micrometers (15 mil) clearance and drawn across the paper. Typically, there was a slight excess of the liquid alkoxide which rolled off of the film. The alkoxide-treated mica paper was suspended and allowed to dry in air at room temperature for approximately 60 minutes, then calcined in a furnace (Thermolyne, F6000 box furnace) by heating to 600° C. at a rate of 4° C./minute in flowing air and holding at 600° C. for 60 minutes to provide a mica paper composite. The weight of the alkoxide decomposition products, obtained from gravimetric analysis of 1"×1" coupons after heating to 600° C. for 60 minutes, was 3.1 wt % based on the total weight of the calcined mica paper composite. For these gravimetric measurements, a control sample of mica paper (Comparative Example A) was also heated to 600° C. The weight difference between the control and the 1"×1" coupon of Example 1 was used to determine the weight difference and the wt % in the final mica paper composite. Duplicate measurements were made to determine the final weight percent values of the mica paper composite of Example 1.

No change in appearance was noted in the mica paper composite after several hours of immersion in distilled water in a sealed vial, indicating greatly increased stability in water as compared with the mica paper control of Comparative Example A and the calcined mica paper control of Comparative Example B.

The thermal expansion coefficient of the mica paper composite for the second heating cycle was measured as 6.2 ppm/° C. from 60° C. to 400° C. and 6.3 ppm/° C. from 60° C. to 350° C. This coefficient of thermal expansion closely matches that of a Mo back electrode, which is about 5 ppm/° C. in this temperature range, and is a characteristic desired of a photovoltaic cell substrate.

The average force to initiate a tear was found to be about 836 g-f (grams-force), which is higher than the tear initiation resistance of Comparative Example A. This data is shown in Table 1.

Example 2

The same procedure was used as described in Example 1, except that Tyzor® NBZ (zirconium tetra n-butanoate, 12 wt % in n-butanol) was used in place of TEOS. The alkoxide was loaded into a 5 mL pipette and poured across a draw-down bar set for 381 micrometers (15 mil) clearance and drawn across the paper. Typically, there was a slight excess of the liquid alkoxide which rolled off of the film. The weight % of the alkoxide decomposition products, derived from gravimetry on 1"×1" coupons after heating to 600° C. for 60 minutes, was 3.6 wt % based on the total weight of the mica paper composite.

No change in appearance was noted in the mica paper composite after several hours of immersion in distilled water in a sealed vial, indicating greatly increased stability in water as compared with the controls of Comparative Examples A and B. The thermal expansion coefficient for the second heating cycle of the mica paper composite was measured as 4.7 ppm/° C. from 60° C. to 400° C. and 5.0 ppm/° C. from 60° C. to 350° C. This coefficient of thermal expansion closely matches that of a Mo back electrode, which is about 5 ppm/° C. in this temperature range, and is a characteristic desired of a photovoltaic cell substrate. The tear initiation resistance was measured to be 1100 grams-force, as shown in Table 1. This value is much larger than the tear initiation resistance of Comparative Example A.

Example 3

The same procedure was used as described in Example 1, except that Tyzor® NPZ (zirconium tetra n-propanoate, 28 wt % in n-propanol) was used in place of TEOS. The alkoxide was loaded into a 5 mL pipette and poured across a draw-down bar set for 381 micrometers (15 mil) clearance and drawn across the paper. Typically, there was a slight excess of the liquid alkoxide which rolled off of the film. The weight % of the alkoxide decomposition products, derived from gravimetry on 1"×1" coupons after heating to 600° C. for 60 minutes as described for Example 1, was 8.1% based on the total weight of the mica paper composite.

No change in appearance was noted in the mica paper composite after several hours of immersion in distilled water in a sealed vial, indicating greatly increased stability in water as compared with the controls of Comparative Examples A and B. The thermal expansion coefficient of the mica paper composite for the second heating cycle was measured as 6.0 from 60° C. to 400° C. and 6.1 ppm/° C. from 60° C. to 350° C. This coefficient of thermal expansion closely matches that of a Mo back electrode, which is about 5 ppm/° C. in this temperature range, and is a characteristic desired of a photovoltaic cell substrate.

The average force to initiate a tear was found to be about 747 g-f. This is higher than the tear initiation resistance of the mica paper control of Comparative Example A.

Example 4

The same procedure was used as described in Example 1, except that Tyzor® TPT (tetraisopropyltitanate) was used in place of TEOS. The alkoxide was loaded into a 5 mL pipette and poured across a draw-down bar set for 381 micrometers (15 mil) clearance and drawn across the paper. Typically, there was a slight excess of the liquid alkoxide which rolled off of the film.

No change in appearance was noted in the mica paper composite after several hours of immersion in distilled water in a sealed vial, indicating greatly increased stability in water as compared with the controls of Comparative Examples A and B. The thermal expansion coefficient of the mica paper composite for the second heating cycle was measured as 6.6 ppm/° C. from 60° C. to 400° C. and 6.6 ppm/° C. from 60° C. to 350° C. This coefficient of thermal expansion closely matches that of a Mo back electrode, which is about 5 ppm/° C. in this temperature range, and is a characteristic desired of a photovoltaic cell substrate.

The average force to initiate a tear was found to be about 896 g-f. This is higher than the tear initiation resistance of the mica paper control of Comparative Example A, as shown in Table 1.

Comparative Example A

Binderless mica paper (76.2 microns thick, 3 mils) as received from Corona Films was used as a control comparison.

The thermal expansion coefficient for the second heating cycle of the untreated mica paper was measured as 4.7 ppm/° C. from 60° C. to 350° C. Compared with the mica paper composites of Examples 1, 2, 3 and 4, the untreated mica paper of the Comparative Example has essentially a similar coefficient of thermal expansion. When immersed in distilled water in a sealed vial, the untreated control sample of mica paper re-dispersed and was unstable in water after approximately 3-5 minutes at room temperature, indicating that it cannot be used in an aqueous process, such as a process to deposit cadmium sulfide or other n-type semiconductors by aqueous routes.

Tear initiation resistance (Grave's tear) measurements were performed according to the procedures described in IPC-TM-650, number 2.4.16 (The Institute for Interconnecting and Packaging Electronic Circuits, Northbrook Ill.). An average of three measurements was used. The average force to initiate the tear was found to be about 625 g-f. This is lower than the tear initiation resistance of Examples 1, 3 and 4.

Comparative Example B

The untreated mica paper of Comparative Example A was heated in a furnace (Thermolyne, F6000 box furnace) by heating to 600° C. at a rate of 4° C./minute in flowing air and holding at 600° C. for 60 minutes to provide a calcined mica paper.

When immersed in distilled water in a sealed vial, the calcined, untreated mica paper redispersed and was unstable in water after approximately 3-5 minutes at room temperature, indicating its instability in water. In contrast, the mica paper composites of Examples 1, 2 3 and 4 showed stability in water for several hours at room temperature.

TABLE 1

Initial Tear Resistance (Tear Strength)

| | Initial Tear Resistance (grams-force) | standard deviation |
| --- | --- | --- |
| Comparative Example A | 623 | 172 |
| Example 1 | 836 | 151 |
| Example 2 | 1100 | 292 |
| Example 3 | 747 | 270 |
| Example 4 | 896 | 136 |

What is claimed is:

1. An article comprising a mica paper composite comprising a composition having the general Formula (VI):

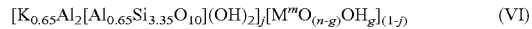

$[K_{0.65}Al_2[Al_{0.65}Si_{3.35}O_{10}](OH)_2]_j[M'''O_{(n-g)}OH_g]_{(1-j)}$ (VI)

wherein
1) M is selected from Si, Al, Ti, Zr, and mixtures thereof; with the proviso that:
   i) when M is Si, Ti, or Zr, the value of m is 4; and
   ii) when M is Al, the value of m is 3;
2) n is a value represented by m/2;
3) g and (n-g) represent molar proportions, where g is a value selected from the range of 0 to n;
4) j represents the weight fraction of mica in the mica paper composite, and the value of j is selected from the range of 0.995 to 0.8.

2. The article of claim 1 wherein the phyllosilicate is selected from muscovite, phlogopyte, illite, zinnwaldite, lepidolite, paragonite, biotite, fluorophlogopite, or combinations thereof.

3. The article of claim 2 wherein the phyllosilicate is selected from muscovite, illite, or combinations thereof.

4. The article of claim 3 wherein M is selected from Si, Ti, Zr, or combinations thereof.

5. The article of claim 4 wherein M is Ti, Si, or combinations thereof.

6. The article of claim 5 wherein M is Zr.

7. The article of claim 1 further comprising an electrode layer, wherein the electrode layer comprises Mo, W, Cr, or mixtures thereof.

8. The article of claim 7, further comprising a light absorber layer.

9. The article of claim 8, wherein the light absorber layer comprises Cu, In, Ga, and Se.

10. The article of claim 9, further comprising an emitter.

11. A photovoltaic cell comprising the article of claim 9.

* * * * *